(12) United States Patent
Kim et al.

(10) Patent No.: US 10,566,207 B2
(45) Date of Patent: Feb. 18, 2020

(54) SEMICONDUCTOR MANUFACTURING METHODS FOR PATTERNING LINE PATTERNS TO HAVE REDUCED LENGTH VARIATION

(71) Applicant: Samsung Electronics Co., Ltd., Suwon-si, Gyeonggi-do (KR)

(72) Inventors: Gyeongseop Kim, Hwaseong-si (KR); Kyung Yub Jeon, Yongin-si (KR); Seul Gi Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/135,669

(22) Filed: Sep. 19, 2018

(65) Prior Publication Data

US 2019/0198340 A1     Jun. 27, 2019

Related U.S. Application Data

(60) Provisional application No. 62/610,643, filed on Dec. 27, 2017.

(51) Int. Cl.
| | |
|---|---|
| *H01L 21/331* | (2006.01) |
| *H01L 21/308* | (2006.01) |
| *H01L 21/311* | (2006.01) |
| *H01L 21/033* | (2006.01) |

(52) U.S. Cl.
CPC ...... *H01L 21/3086* (2013.01); *H01L 21/0337* (2013.01); *H01L 21/31144* (2013.01)

(58) Field of Classification Search
CPC ............. H01L 21/3086; H01L 21/0337; H01L 21/31144

USPC ......................................................... 438/703
See application file for complete search history.

(56) References Cited

U.S. PATENT DOCUMENTS

| | | | | |
|---|---|---|---|---|
| 6,518,147 B1* | 2/2003 | Villa | ................. | H01L 21/76208 |
| | | | | 257/E21.554 |
| 7,368,390 B2* | 5/2008 | Czech | ................. | H01L 21/0332 |
| | | | | 438/694 |
| 7,550,391 B2* | 6/2009 | Jeon | ..................... | H01L 21/0337 |
| | | | | 257/E21.023 |
| 7,709,389 B2* | 5/2010 | Kim | .................... | H01L 21/0337 |
| | | | | 216/46 |
| 8,026,179 B2* | 9/2011 | Lue | ..................... | H01L 21/0337 |
| | | | | 257/E21.023 |
| 8,518,831 B2 | 8/2013 | Hwang | | |
| 8,927,425 B1* | 1/2015 | Lam | ................. | H01L 21/76802 |
| | | | | 438/270 |
| 9,147,653 B2 | 9/2015 | Yuan et al. | | |
| 9,362,133 B2 | 6/2016 | Shamma et al. | | |
| 9,437,481 B2* | 9/2016 | Yuan | ................. | H01L 21/31144 |

(Continued)

*Primary Examiner* — Vu A Vu

(74) *Attorney, Agent, or Firm* — Harness, Dickey & Pierce, P.L.C.

(57) ABSTRACT

A method for defining a length of a fin including forming a plurality of first slice walls on a mask material layer, which is provided over the fin, using a plurality of hard mask patterns, providing a plurality of fill mask patterns self-aligned with respect to the plurality of first slice walls to expose one or more select areas between one or more pairs of adjacent ones of the plurality of first slice walls, and providing a trim mask pattern including one or more openings and self-aligned with respect to the plurality of second slice walls to expose one or more of the plurality of first slice walls may be provided.

20 Claims, 23 Drawing Sheets

(56) References Cited

U.S. PATENT DOCUMENTS

| | | | |
|---|---|---|---|
| 9,768,025 B2 | 9/2017 | Siew et al. | |
| 9,773,676 B2 * | 9/2017 | Chang | H01L 21/0338 |
| 9,818,611 B2 * | 11/2017 | deVilliers | H01L 21/0337 |
| 9,934,970 B1 * | 4/2018 | Burns | H01L 21/0337 |
| 2014/0083972 A1 | 3/2014 | Oyama et al. | |
| 2017/0300608 A1 | 10/2017 | Narisetty et al. | |

* cited by examiner

SEMICONDUCTOR MANUFACTURING METHODS FOR PATTERNING LINE PATTERNS TO HAVE REDUCED LENGTH VARIATION

CROSS-REFERENCE TO RELATED APPLICATION

This non-provisional application claims priority from U.S. Provisional Patent Application No. 62/610,643 filed on Dec. 27, 2017 in the U.S. Patent and Trademark Office, and all the benefits accruing therefrom under 35 U.S.C. 119, the contents of which are incorporated herein by reference in its entirety.

BACKGROUND

1. Field

Some example embodiments of the inventive concepts disclosed herein relate to semiconductor manufacturing methods for patterning line patterns to have a reduced length variation, and more particularly, to semiconductor manufacturing methods for patterning fins protruding from a substrate to have a reduced length variation.

2. Description of the Related Art

The large integration scale of semiconductor devices has led to an increased use of light of shorter wavelengths in a photolithography device fabrication process. Recently, extreme ultraviolet (EUV) photolithography using an extreme EUV wavelength, (e.g., 13.5 nm) is being extensively studied and employed to realize a design size of 100 nm or less.

A vertical field effect transistor (VTFET) are being implemented using a fin protruding from a semiconductor substrate. In a method for forming the VTFET, fins may be formed to protrude from a semiconductor substrate and extend in a first direction. Then, some portion of some of the fins are cut (e.g., removed) using a mask pattern extending in a second direction to create room for, for example, isolation regions to be ultimately formed to separate individual VTFETs from one another. Such a fin cut process is sometimes interchangeably referred to as a "FH patterning process". The FH patterning process can be performed by using a single EUV exposure photolithography. However, lengths of fins implemented by the single EUV exposure photolithography tend to vary beyond a tolerable range, thus VTFETs including such fins tends to fail to meet a performance variation target.

SUMMARY

Some example embodiments of the inventive concepts provide semiconductor manufacturing methods for patterning line patterns to have a reduced length variation.

Some example embodiments of the inventive concepts provide semiconductor manufacturing methods for patterning fins protruding from a substrate to have a reduced length variation.

Some example embodiments of the inventive concepts provide vertical tunneling field effect transistors (VTFETs) having improved electrical performances.

According to an example embodiment of the inventive concepts, a method for defining a length of a fin that protrudes from a substrate may include providing a mask material layer on the fin, the fin protruding from the substrate and horizontally extending in a first direction, forming a plurality of first slice walls on the mask material layer using a plurality of hard mask patterns, the plurality of first slice walls horizontally extending in a second direction, the second direction crossing the first direction, providing a first insulating layer on the plurality of first slice walls and the mask material layer, providing a plurality of fill mask patterns on the first insulating layer and to be self-aligned with respect to the plurality of first slice walls to expose one or more select areas between one or more pairs of adjacent ones of the plurality of first slice walls, removing the first insulating layer at the exposed one or more select areas, and the plurality of fill mask patterns, providing one or more second slice walls between one or more corresponding pairs of the plurality of first slice walls at the exposed one or more select areas, respectively, providing a second insulating layer on the first insulating layer, the plurality of first slice walls, and the one or more second slice walls, providing a trim mask pattern including one or more openings on the second insulating layer such that the trim mask pattern is self-aligned with respect to the one or more second slice walls to expose one or more of the plurality of first slice walls, removing one or more of the plurality of first slice walls exposed by the trim mask pattern, removing the trim mask pattern and the first and second insulating layers, patterning the mask material layer using remaining ones of remaining ones of the plurality of first slice walls and the one or more second slice walls to form a plurality of fin cut mask patterns, and cutting the fin to have a length using the plurality of fin cut mask patterns.

According to an example embodiment of the inventive concepts, a method for patterning a line shape structure to have a length may include providing a plurality of line shape structures on a substrate, the plurality of line shape structures horizontally extending in a first direction, providing a mask material layer on the plurality of line shape structures, providing a first material layer on the mask material layer, providing a plurality of first hard mask patterns on the first material layer, patterning the first material layer using the plurality of hard mask patterns to form a plurality of first slice walls, the plurality of first slice walls horizontally extending in a second direction, the second direction crossing the first direction, providing a first insulating layer on the plurality of first slice walls and the mask material layer, providing a plurality of fill mask patterns on the first insulating layer such that some sides of the plurality of fill mask patterns that extends along the second direction are aligned to central positions of corresponding ones of the plurality of first slice walls, respectively, to expose one or more select areas between one or more pairs of adjacent ones of the plurality of first slice walls, removing the first insulating layer at the exposed one or more select areas and the plurality of fill mask patterns, providing one or more second slice walls at the exposed one or more select areas, providing a second insulating layer on the first insulating layer, the plurality of first slice walls, and the one or more second slice walls, providing a trim mask pattern on the second insulating layer, the trim mask pattern including one or more openings on the second insulating layer such that select sides of the one or more openings that extend along the second direction are aligned to central positions of corresponding ones of the one or more second slice walls, respectively to expose one or more of the plurality of first slice walls, removing the one or more of the plurality of first slice walls exposed by the trim mask pattern, removing the trim mask pattern and the first and second insulating layers, patterning the mask material layer using remaining ones of the plurality of first slice walls and the one or more second slice walls to form a plurality of second hard mask patterns, and patterning the plurality of line shape structures using the plurality of second hard mask patterns.

According to an example embodiment of the inventive concepts, a method for defining a line pattern to have a length may include providing a plurality of line patterns on a substrate, the plurality of line patterns horizontally extending in a first direction, providing a mask material layer on the substrate including the plurality of line patterns, forming a plurality of first slice walls using a self-aligned double patterning (SADP), the plurality of first slice walls horizontally extending in a second direction different from the first direction, providing one or more second slice walls between one or more pairs of adjacent ones of the plurality of first slice walls exposed by a plurality of fill mask patterns, some sides of the plurality of fill mask patterns extending along the second direction and aligned to central positions of corresponding ones of the plurality of first slice walls, respectively, removing one or more of the plurality of first slice walls exposed by a trim mask patterns, the trim mask pattern including one or more openings such that select sides of the one or more openings extending along the second direction and aligned to central positions of corresponding ones of the one or more second slice walls, respectively, patterning the mask material layer using remaining ones of the plurality of first slice walls and the one or more second slice walls as a plurality of hard mask patterns, and patterning the plurality of line patterns to have a length using the plurality of hard mask patterns.

BRIEF DESCRIPTION OF THE DRAWINGS

The above and other features and advantages of the present invention will become more apparent by describing in detail some example embodiments thereof with reference to the attached drawings in which.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. (Expressions such as "at least one of," when preceding a list of elements, modify the entire list of elements and do not modify the individual elements of the list.)

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments of the present inventive concepts will be explained with reference to the accompanying drawings.

Figure 1:
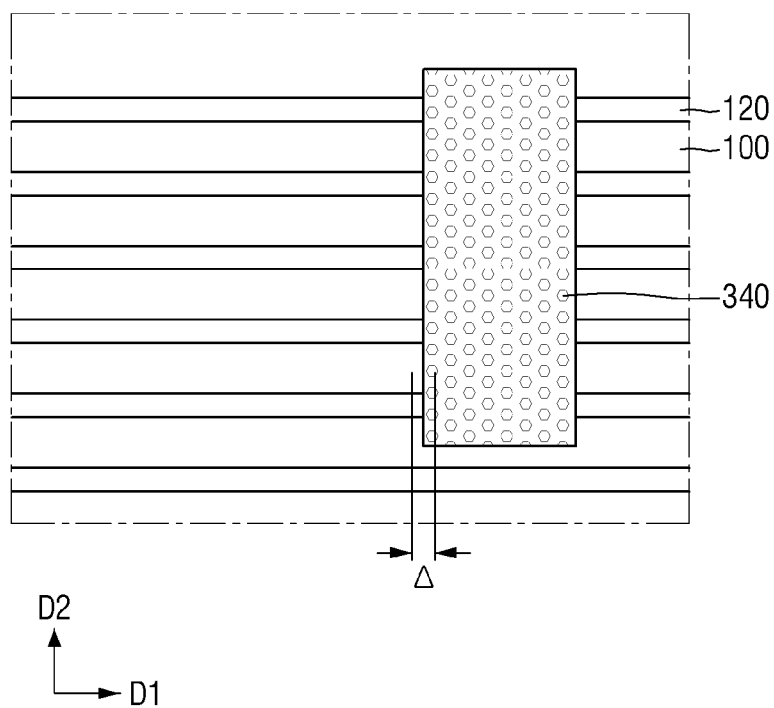
FIG. 1 illustrates a plurality of fin cut mask patterns on a plurality of fins in a plan view.

FIG. 1 shows a plurality of fin cut mask patterns on a plurality of fins in a plan view. The plurality of fins 120 are structures protruding from a semiconductor substrate 100. The plurality of fins 120 may extend in a first direction D1, and the plurality of fin cut mask patterns (also known as a plurality of FH patterning mask patterns) 340 may extend in a second direction D2 crossing the first direction D1. In some example embodiments, the second direction D2 may be perpendicular to the first direction D1.

In the case that the fin cut process (interchangeably referred to as a FH patterning process) is performed using the plurality of fin cut mask patterns 340 in a single Extreme UV (EUV) exposure photolithography, a length variation $\Delta$ of about 4.2 nm (corresponding to 4 $\sigma$) is observed in a 40 nm design rule-based SRAM device. Such length variation $\Delta$ may result in an undesirably large performance variation in the resulted SRAM device.

Figure 2:
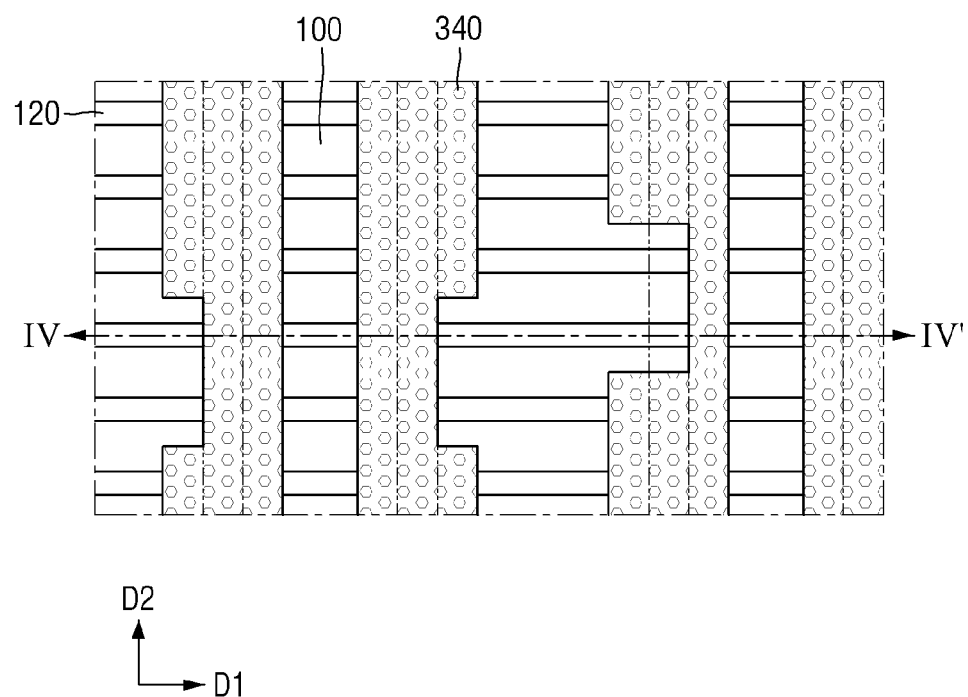
FIG. 2 illustrates a plurality of fins and a plurality of fin cut mask patterns in a plan view, according to an example embodiment of the inventive concepts.

FIG. 2 illustrates a plurality of fins and a plurality of fin cut mask patterns in a plan view, according to an example embodiment of the inventive concepts. For brevity's sake, previously described elements may be identified by similar or identical reference numbers without repeating overlapping descriptions thereof.

Referring to FIG. 2, the plurality of fins 120 may extend in a first direction D1, and the plurality of fin cut mask patterns 340 may extend in a second direction D2, which is perpendicular to the first direction D1. As illustrated, the plurality of fin cut mask patterns 340 may have different width along the second direction D2 (e.g., an extension direction of the plurality of fin cut mask patterns 340). The leftmost one from among the plurality of fin cut mask patterns 340 has a width of 3 units for the first, second, and third fins 120 from top, a width of 2 units for the fourth and fifth fins 120 from top, and a width of 3 units for the sixth fin 120 from top. Similarly, the second one from left from among the plurality of fin cut mask patterns 340 has a width of 3 units for the first, second, and third fins 120 from top, a width of 2 unit for the fourth and fifth fins 120 from top, and a width of 3 units for the sixth fin 120 from top. The leftmost one and the second one from left from among the plurality of fin cut mask patterns 340 may be symmetrical with respect to an imaginary line therebetween in the second direction D2 (e.g., an extension direction of each of the plurality of fin cut mask patterns 340). The third one from left from among the plurality of fin cut mask patterns 340 has a width of 3 units for the first and second fins 120 from top, a width of 2 units for the third and fourth fins 120 from top, and a width of 3 units for the fifth and sixth fin 120 from top. The rightmost one from left from among the plurality of fin cut mask patterns 340 has a width of 2 units for the first through sixth fins 120. As illustrated, each of the first, second, and third fin cut mask patterns from left include a bay shape at one side.

Figure 3A:
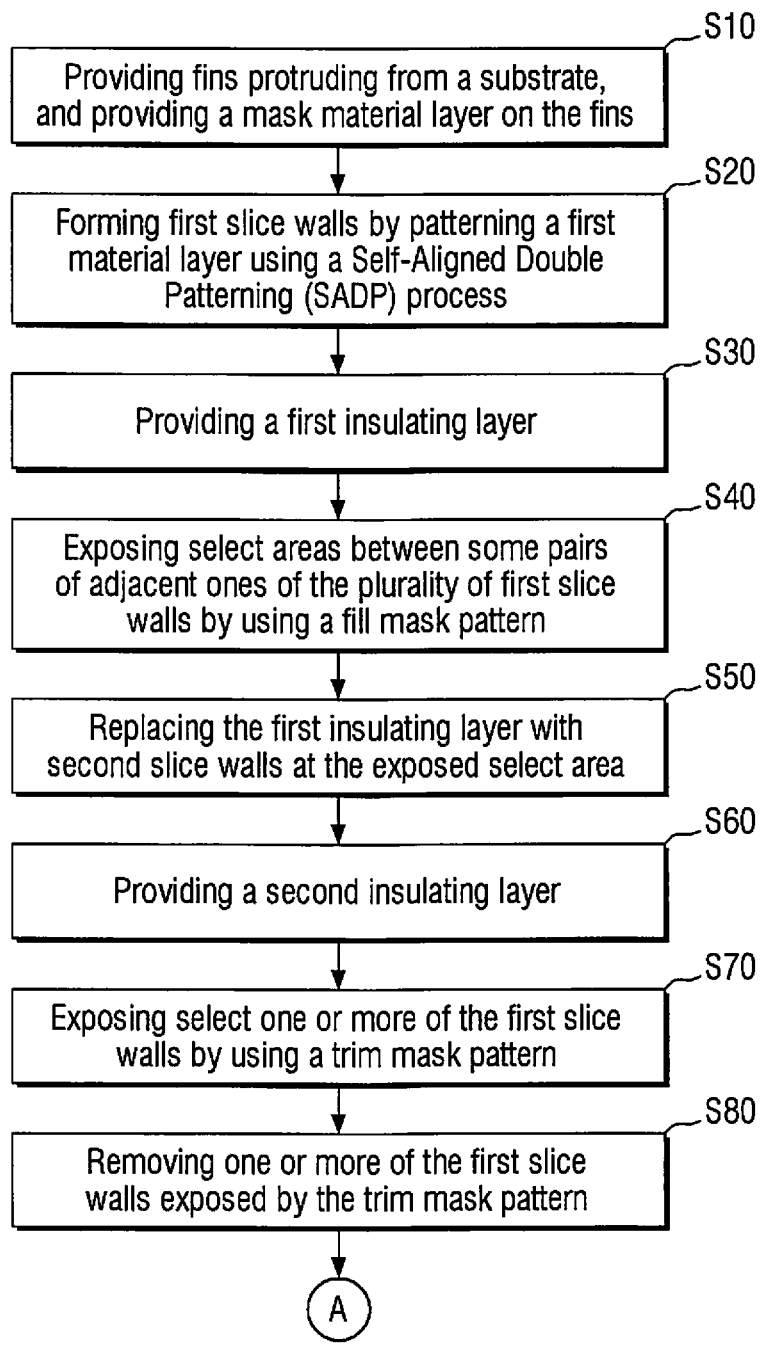
FIGS. 3A and 3B are a flowchart illustrating operations for forming the plurality of fin cut mask patterns of FIG. 2 and cutting a plurality of fins using the plurality of fin cut mask patterns as a mask, according to an example embodiment of the inventive concepts.
Figure 3B:
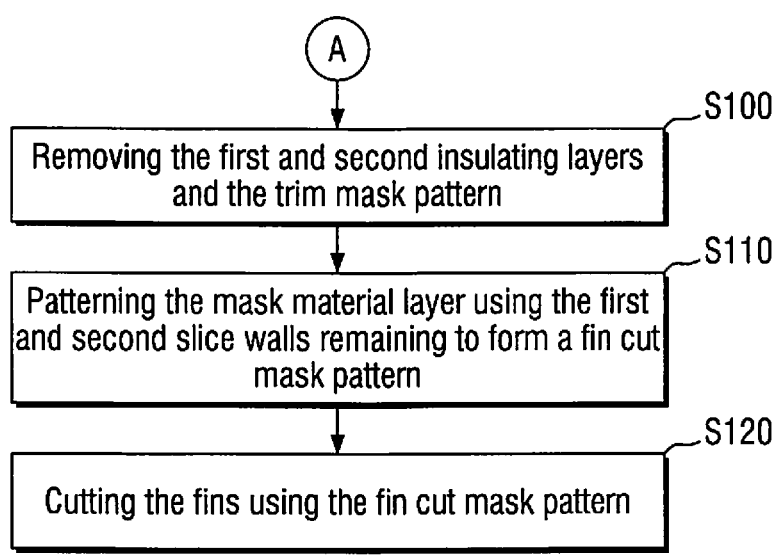

FIGS. 3A and 3B are a flowchart illustrating operations for forming the plurality of fin cut mask patterns of FIG. 2 and cutting a plurality of fins using the plurality of fin cut mask patterns as a mask, according to an example embodiment of the inventive concepts.

Referring to FIGS. 3A and 3B, in operation S10, a plurality of fins may protrude from a substrate and extend in a first direction, and a mask material layer is formed on the substrate including the plurality of fins. In operation S20, a plurality of first slice walls may be formed by patterning the mask material layer using a Self-Aligned Double Patterning (SADP) process. The SADP process refers to a patterning process in which a film layer is formed on the sidewalls of a pre-patterned features by deposition or reaction of the film layer on the pre-patterned features (e.g., mandrels), the film layer is etched to remove all the film material on the horizontal surfaces and leave only the film material on the sidewalls of the pre-patterned features to form a plurality of spacers, and the original pre-patterned features are removed to only leave the plurality of spacers. Because there are two spacers are associated with every line, a line density can be doubled if lines are patterned by using the SADP process.

In some example embodiments, the pre-patterned features (e.g., mandrels) can be designed so that some pairs of facing ones of the plurality of spacers are merged with each other, so as to define a different fin length.

Subsequently, a first insulating layer may be provided on the substrate including the plurality of first slice wall in operation S30, and select areas between some pairs of adjacent ones of the plurality of first slice walls may be exposed by using a plurality of fill mask patterns in operation S40. In operation S50, the first insulating layer may be replaced with a plurality of second slice walls at the exposed select areas, respectively.

In operation S60, a second insulating layer may be provided on the substrate including the plurality of first slice walls, the plurality of first slice walls, and the first insulating layer. Then, select one or more of the first slice walls may be exposed by using a trim mask pattern in operation S70, and one or more of the first slice walls exposed by the trim mask pattern may be removed in operation S80. Then, the first and second insulating layers and the trim mask pattern may be removed in operation S100. In operation S110, the mask material layer may be patterned using remaining ones of the plurality of first slice walls and the plurality of second slice walls to form a fin cut mask pattern. Then, in operation S120, the plurality of fins may be patterned (e.g., cut) using the fin cut mask pattern.

Herein below, the operations S10 through S130 will be explained in detail with reference to FIGS. 4A-18.

FIGS. 4A, 5, 6, 7, 8, 9, 10A, 11, 12, 13, 14, 15A, 16, 17, 18, and 19 are cross-sectional views taken along line IV-IV' of FIG. 2 to explain the operations of FIGS. 3A and 3B, according to an example embodiment of the inventive concepts. FIGS. 4B, 10B, and 15B are plan views of mask patterns illustrated in FIGS. 4A, 10A and 15A, respectively, according to an example embodiment of the inventive concepts. For brevity's sake, previously described elements may be identified by similar or identical reference numbers without repeating overlapping descriptions thereof.

FIGS. 4A, and 5 through 8 are cross-sectional views taken along line IV-IV' of FIG. 2 to explain operation S20. FIG. 4B is a plan view of mandrel mask patterns.

Figure 4A:
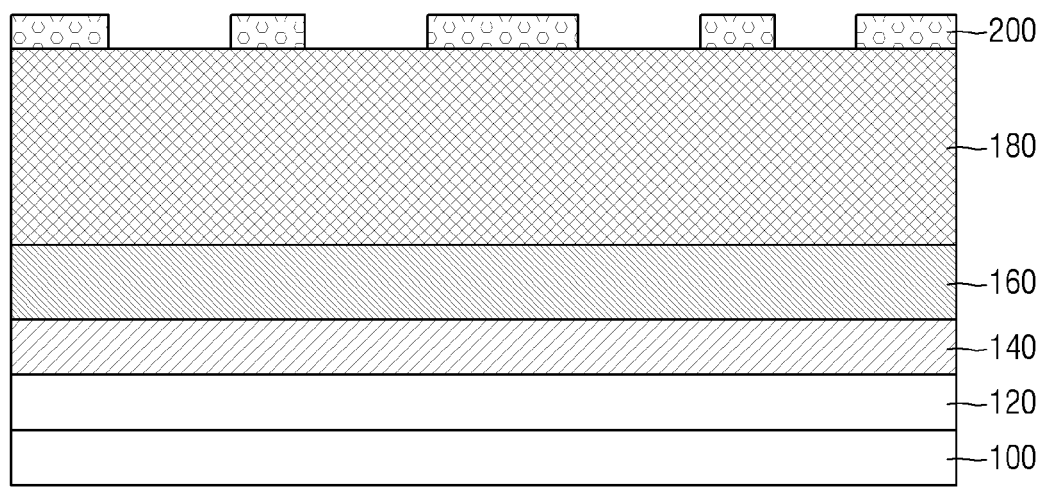
FIGS. 4A, 5, 6, 7, 8, 9, 10A, 11, 12, 13, 14, 15A, 16, 17, 18, and 19 are cross-sectional views taken along line IV-IV' of FIG. 2 to explain the operations of FIGS. 3A and 3B, according to an example embodiment of the inventive concepts.
Figure 4B:
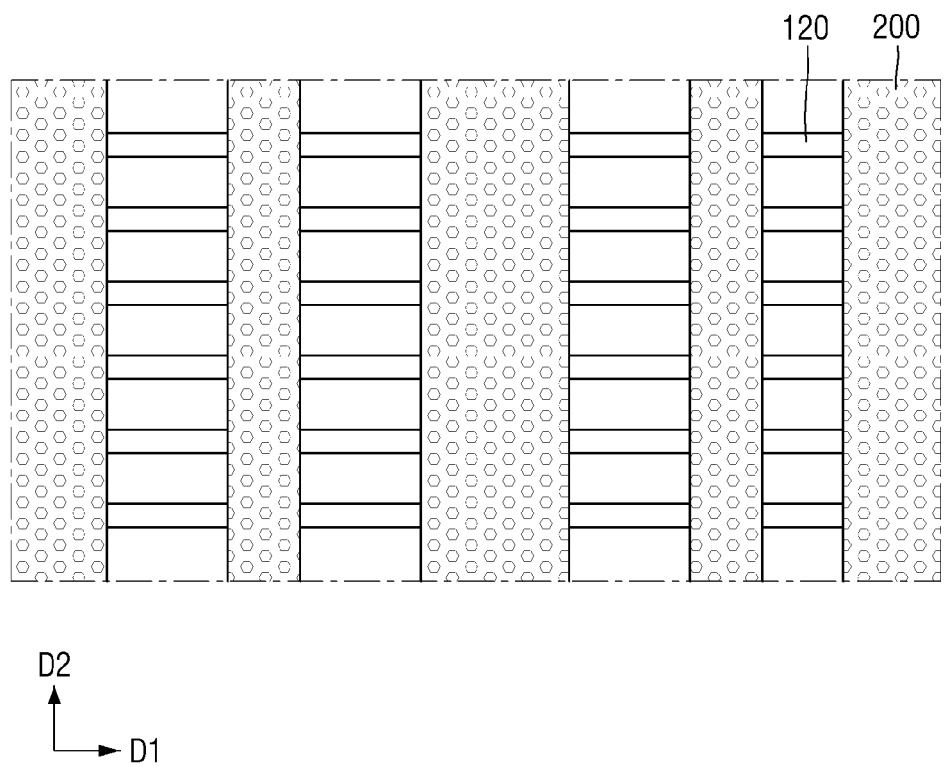
FIGS. 4B, 10B, and 15B are plan views of the mask patterns illustrated in FIGS. 4A, 10A and 15A, respectively, according to an example embodiment of the inventive concepts.

Referring to FIG. 4A, a fin 120 may be provided on a semiconductor substrate 100, a mask material layer 140 may be provided on the fin 120, a first material layer 160 may be provided on the mask material layer 140, a mandrel layer 180 may be provided on the first material layer 160, and a plurality of mandrel mask patterns 200 may be provided on the mandrel layer 180.

The substrate 100 may be a bulk silicon. For example, the substrate 100 may be a silicon substrate, or may include a material other than silicon, including but not limited to Ge, SiGe, SiC, GeP, GeN, InGaAs, GaAs, InSb, InAs, GaSb, and InP. The semiconductor substrate 100 may be a portion of a bulk silicon wafer.

The substrate 100 may be a silicon-on-insulator (SOI). The substrate 100 may be a silicon portion of a Silicon-On-Insulator (SOI) wafer. In some example embodiments, the substrate 100 may refer to a semiconductor layer epitaxially grown on a base substrate.

The fin 120 may be formed to extend along a first direction by etching the semiconductor substrate 100 using mask patterns 200. In some example embodiments, the fin 120 may be formed using an epitaxial growth process on the substrate 100.

The mandrel layer 180 may have a high etch selectivity with regard to the underlying first material layer 160. In some example embodiments, the mask material layer 140 may include a hard mask material (e.g., silsesquioxane material or silanol material), the first material layer 160 may include nitride, the mandrel layer 180 may include an organic layer made of Spin-on Organic Hard-mask (SOH) material. The SOH material may be Si-based material or carbon-based material.

Referring to FIG. 4B, the mandrel mask patterns 200 may extend in a second direction D2, which is perpendicular to the first direction D1 along which the plurality of fins 120 extend. The mandrel mask patterns 200 may be formed by projecting patterns on a photomask onto a photoresist (not shown) coated on the substrate 100 including the fins 120, the mask material layer 140, the first material layer 160, and the mandrel layer 180.

Figure 5:
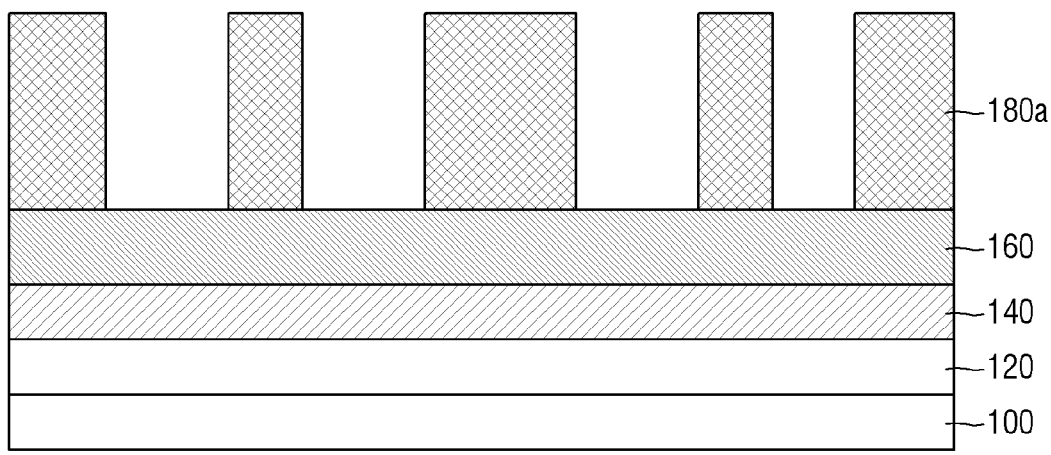

Referring FIG. 5, a plurality of mandrel structures 180a may be formed by patterning (e.g., by performing reactive ion etch (RIE) process) the mandrel layer 180 using the mandrel mask patterns 200 as a mask.

Figure 6:
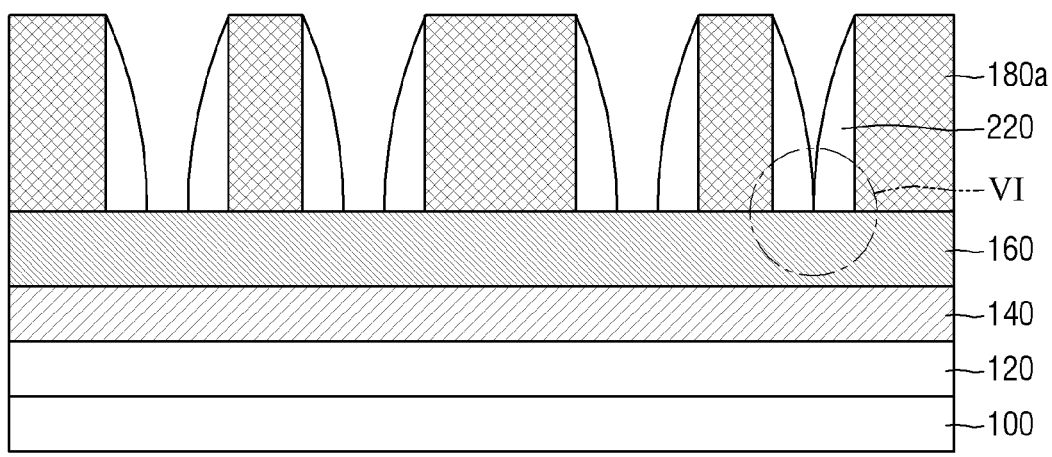

Referring FIG. 6, a plurality of spacers 220 may be formed on sidewalls of the plurality of mandrel structures 180a. For example, a spacer layer may be conformally deposited on the plurality of mandrel structures 180a by using, for example, a chemical vapor deposition or an atomic layer deposition method. Then, the spacer layer may be etched to leave the plurality of spacers 220 on the sidewalls of the plurality of mandrel structures 180a. The mandrel structures 180a can be designed so that some pairs of facing ones of the plurality of spacers 220 to be formed are merged with each other so as to leave space therebetween, as denoted by a dotted circle VI. In some example embodiments, the mandrel structures 180a may be arranged such that a lateral width of the merged spacers may be less than 2× a width of a spacer 220.

The spacer layer may include nitride (e.g., $Si_3N_4$) or oxide (e.g., $SiO_2$). The spacer layer may include a material having a high etch electivity with respect to the first material layer 160. For example, the space layer may include $Si_3N_4$, and the first material layer 160 may include SOH material.

Figure 7:
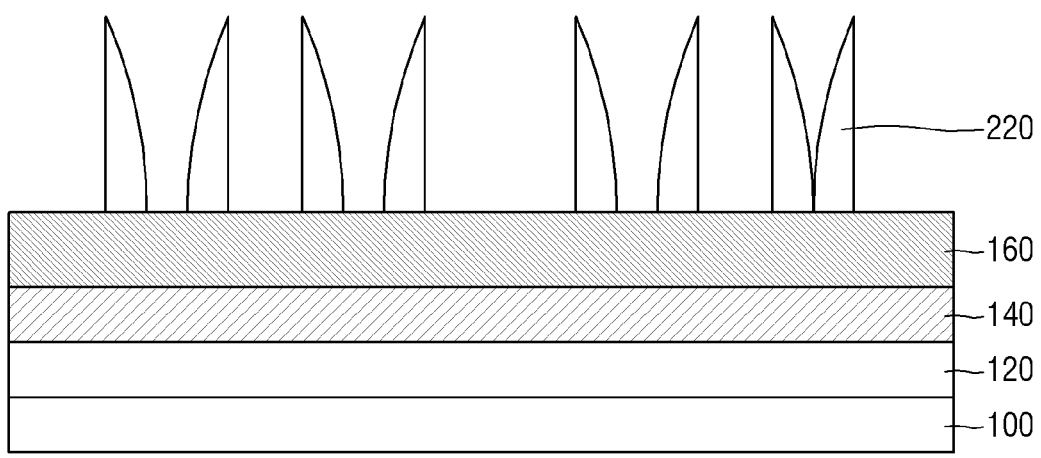

Referring FIG. 7, the plurality of mandrel structures 180a may be removed by performing, for example, a wet etch process. In the case where the plurality of mandrel structures 180a include SOH material and the plurality of spacers 220 include silicon nitride, the plurality of mandrel structures 180a may be removed by a wet etch process, which has a high etch selectivity to the SOH material compared with the silicon nitride. Thus, only the plurality of spacers 220 may remain on the first material layer 160. In some example embodiments, the plurality of mandrel structures 180a may be removed by a dry etch process (e.g., reactive ion etch process) as long as the process has a high etch selectivity to the SOH material compared with the silicon nitride.

Figure 8:
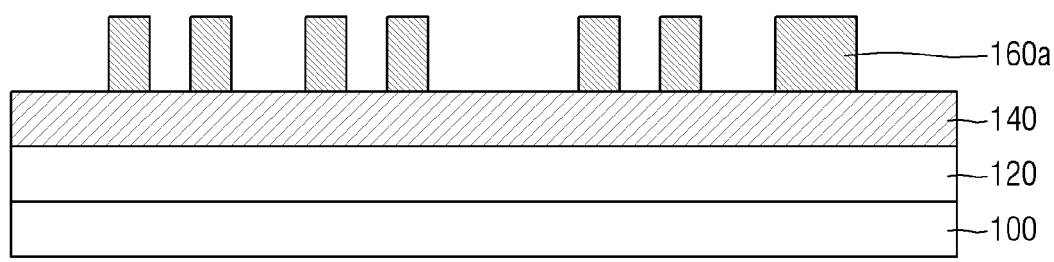

Referring FIG. 8, the first material layer 160 may be etched using the remaining spacers 220 as a mask to form a plurality of first slice walls 160a. The spacer layer may include a material having a high etch electivity with respect to the first material layer 160. For example, the first material layer 160 may include nitride (e.g., $Si_3N_4$) and the spacer layer may include oxide (e.g., $SiO_2$).

Figure 9:
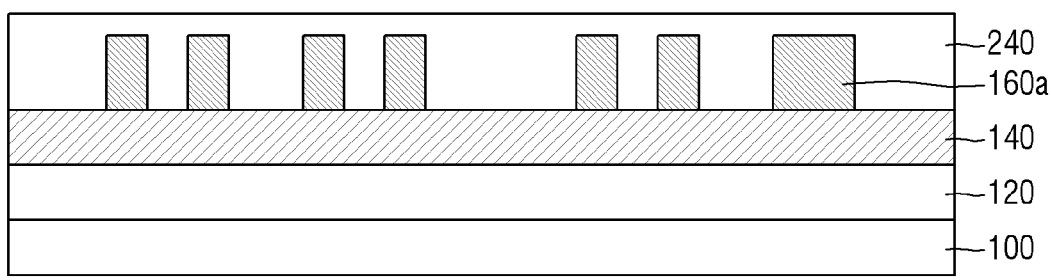

Referring FIG. 9, a first insulating layer 240 may be deposited on the plurality of first slice walls formed in FIG. 8. FIG. 9 corresponds to operation S30 of FIG. 3A.

Figure 10A:
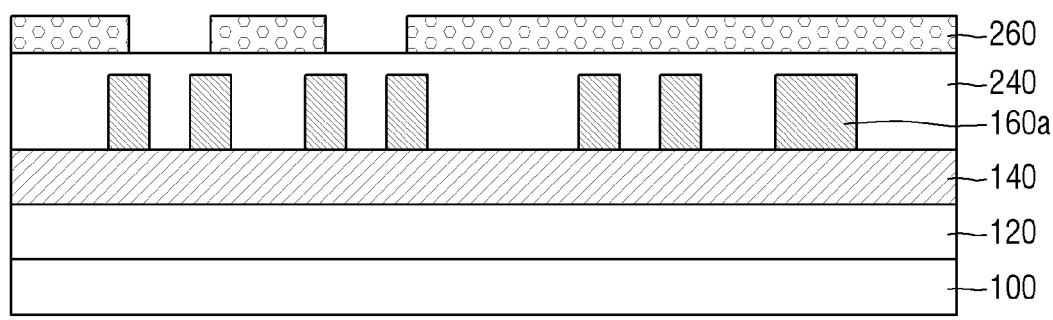
Figure 10B:
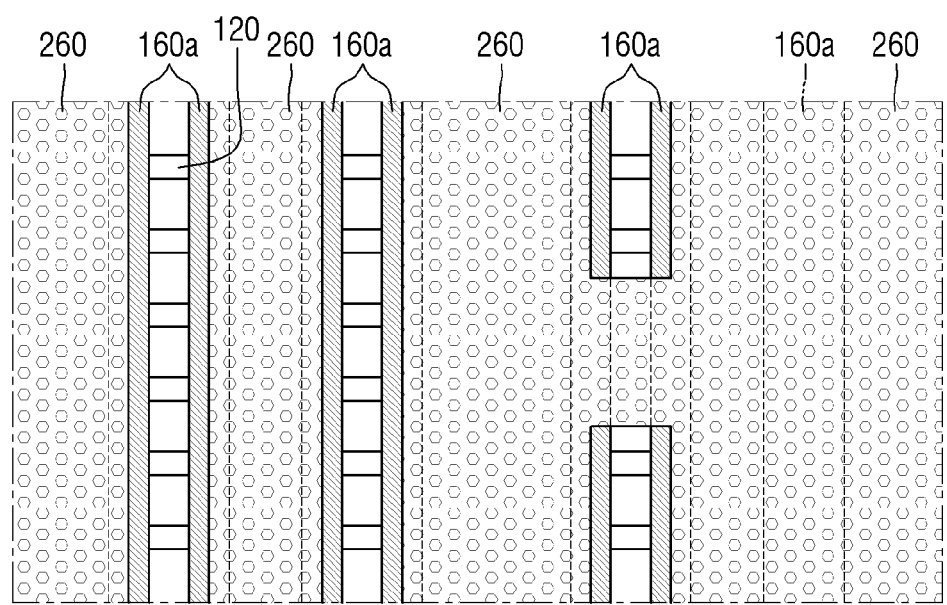
Figure 10B:
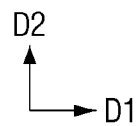

FIG. 10A is a cross-sectional view taken along line IV-IV' of FIG. 2. FIG. 10B is a plan view of a plurality of fill mask patterns. FIGS. 10A and 10B correspond to operation S40 of FIG. 3A.

Referring to FIG. 10A, a plurality of fill mask patterns 260 may be formed on the first insulating layer 240. The first insulating layer 240 may be formed by using, for example, a chemical deposition process or an atomic layer deposition process. For example, the first insulating layer 240 may include SOH material.

Referring to FIG. 10B, the plurality of fill mask patterns 260 may extend in the second direction D2, which is perpendicular to the first direction D1 along which the plurality of fins 120 extend. The plurality of fill mask patterns 260 may be provided on the first insulating layer 240 such that some of the plurality of fill mask patterns 260 are self-aligned with respect to corresponding ones of the plurality of first slice walls 160a, respectively, to expose select areas between some pairs of adjacent ones of the plurality of first slice walls 160a. For example, the plurality of fill mask patterns 260 are provided such that at least one side of at least one of the plurality of fill mask patterns 260 that extends along the second direction D2 is aligned to a central position of corresponding at least one of the plurality of first slice walls 160a.

Because the plurality of fill mask patterns 260 are provided such that at least one side of the plurality of fill mask patterns 260 that extends along the second direction D2 is aligned to a central position of corresponding at least one of the plurality of first slice walls 160a, the variation caused by a single EUV exposure photolithography may be confined within a width of the corresponding at least one of the plurality of first slice walls 160a. Accordingly, size variations (e.g., a length variation of the plurality of fins) that could be caused by, for example, a single EUV exposure photolithography may be prevented from reflected on the actual final patterns of the plurality of fins.

Figure 11:
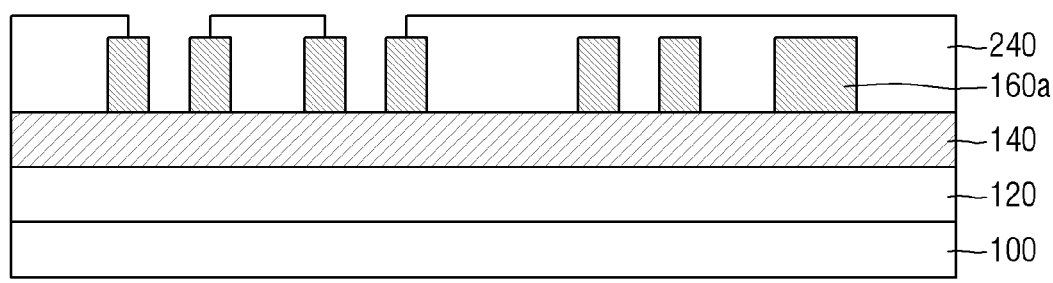
Figure 12:
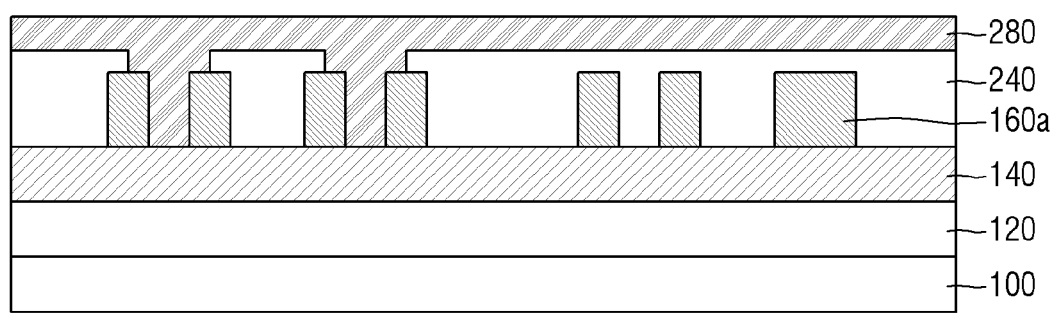
Figure 13:
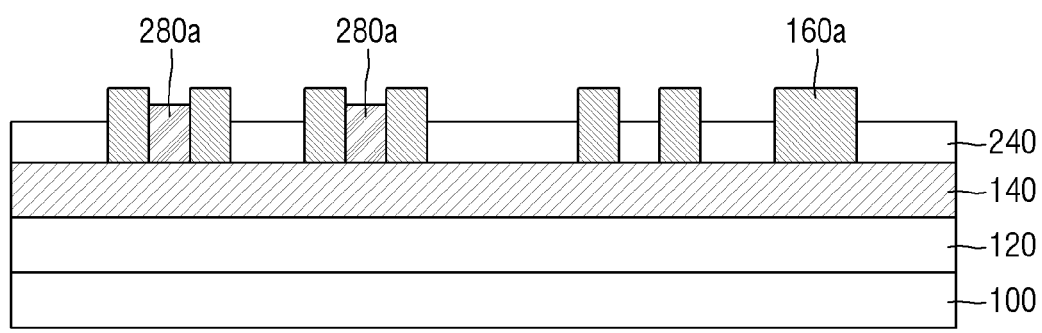

FIGS. 11, 12, and 13 correspond to operation S50 of FIG. 3A. Referring to FIG. 11, the first insulating layer 240 at select areas exposed by the plurality of fill mask patterns 260 may be etched by using, for example, an RIE process. As illustrated in FIGS. 12 and 13, the second material layer 280 may be formed to fill the select areas, at which the first insulating layer 240 is removed, and to cover the plurality of first slice walls 160a and the first insulating layer 240, and then the second material layer 280 may be etched-back to leave one or more second slice walls 280a between a corresponding pair of the plurality of first slice walls 160a at the select areas exposed by the plurality of fill mask patterns 260.

The second material layer 280 may have a high etch selectivity with regard to the plurality of first slice walls 160a (e.g., the first material layer 160). The second material layer 280 may not have a high etch selectivity with regard to the first insulating layer 240. For example, the second material layer 280 may include oxide, the plurality of first slice walls 160a (e.g., the first material layer 160) may include nitride (e.g., $Si_3N_4$), and the first insulating layer 240 may include SOH material.

Figure 14:
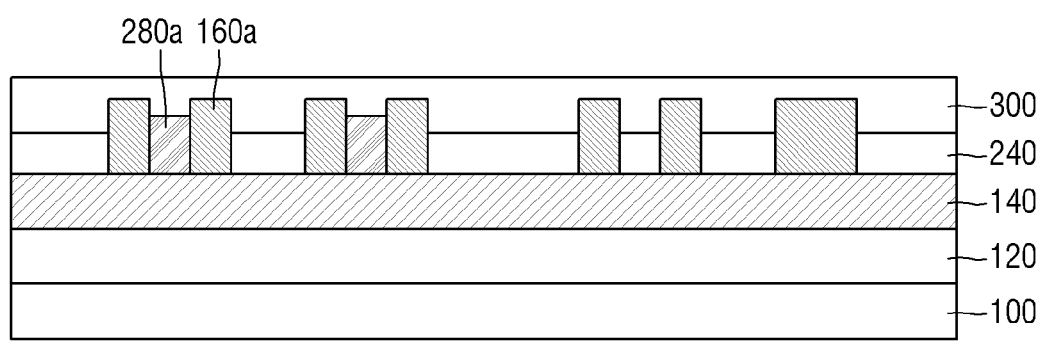

Referring FIG. 14, a second insulating layer 300 may be deposited on the plurality of first slice walls 160a, one or more second slice walls 280a, and the first insulating layer 240. FIG. 14 corresponds to operation S60 of FIG. 3A. The second insulating layer 300 may be formed by using, for example, a chemical deposition process or an atomic layer deposition process. The first insulating layer 240 and the second insulating layer 300 may have comparable etch characteristics. For example, the first insulating layer 240 and the second insulating layer 300 may include SOH material.

Figure 15A:
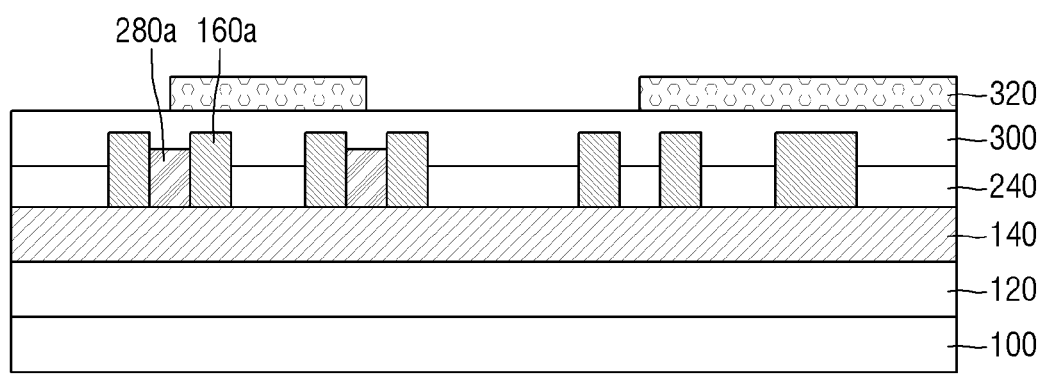
Figure 15B:
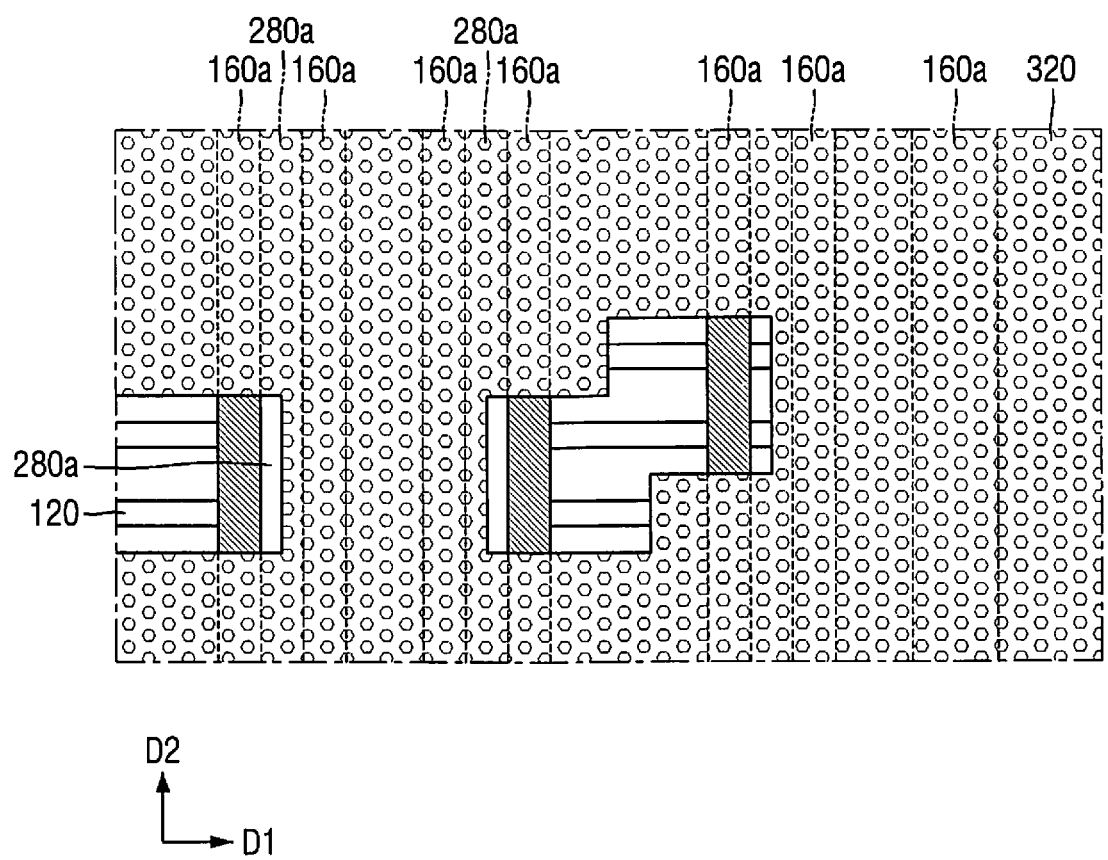

FIG. 15A is a cross-sectional view taken along line IV-IV' of FIG. 2. FIG. 15B is a plan view of a trim mask pattern. FIGS. 15A and 15B correspond to operation S70 of FIG. 3A.

Referring to FIG. 15A, a trim mask pattern 320 may be provided on the second insulating layer 300. Referring to FIG. 15B, the trim mask pattern 320 may extend in the second direction D2, which is perpendicular to the first direction D1 along which the plurality of fins 120 extend. The trim mask pattern 320 may be provided on the second insulating layer 300 such that the trim mask patterns 320 are self-aligned with respect to corresponding one or more second slice walls 280a to expose one or more of the plurality of first slice walls 160a. For example, the trim mask pattern 320 are provided such that at least one side of the trim mask pattern 320 that extends along the second direction D2 is aligned to a central position of a corresponding at least one of the one or more second slice walls 280a.

Because the trim mask pattern 320 are provided such that at least one side of the trim mask pattern 320 that extends along the second direction is aligned to a central position of a corresponding at least one of the one or more second slice walls 280a, the variation caused by a single EUV exposure photolithography may be confined within a width of the corresponding at least one of the one or more second slice walls 280a. Accordingly, size variations (e.g., a length variation of the plurality of fins) that could be caused by, for example, a single EUV exposure photolithography may be prevented from reflected on the actual final patterns of the plurality of fins.

By appropriately arranging positions of mandrel structures during the SADP process, blocking certain areas using a plurality of fill mask patterns, and opening certain areas by using one or more opening in a trim mask pattern, process variations associated with an EUV photolithography may be confined within corresponding one or more first slice walls and corresponding one or more second slice walls. Thus, the EUV photolithography-induced process variations may not be projected to the fin patterns defined thereby, and thus the defined fin patterns may vary to a lesser extent.

By using a plurality of fill mask patterns and a trim mask pattern having one or more openings, the various fin cut mask patterns 340 as illustrated in FIG. 2 can be implemented with relative ease. For example, some of the plurality of fin cut mask patterns 340 may be desired to be laterally recessed at right angles at a side. According to some example embodiments of the present inventive concepts, such mask patterns may be implemented with relative ease.

Figure 16:
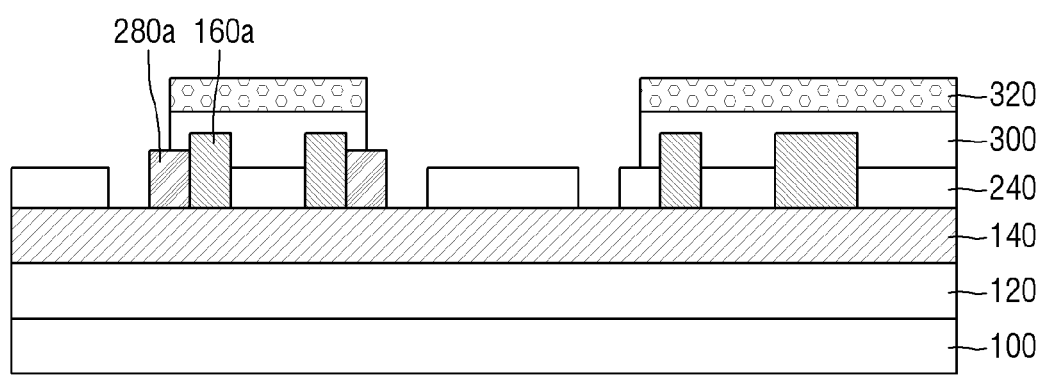

Referring to FIG. 16, the one or more of the plurality of first slice walls 160a exposed by the trim mask pattern 320 may be removed by using, for example, a wet etch process. The one or more second slice walls 280a (e.g., the second material layer 280) may have an etch selectivity with respect to the plurality of first slice walls 160a (e.g., the first material layer 160). For example, the one or more second slice walls 280a (e.g., the second material layer 280) may include oxide (e.g., $SiO_2$) and the plurality of first slice walls 160a (e.g., the first material layer 160) may include nitride (e.g., $Si_3N_4$). In such cases, one or more of the plurality of first slice walls 160a (e.g., the first material layer 160), which is made of nitride (e.g., $Si_3N_4$), that are exposed by the trim mask pattern 320, may be removed by using, for example, a phosphoric acid-based wet etch process. FIG. 16 corresponds to operation S80 of FIG. 3A.

Figure 17:
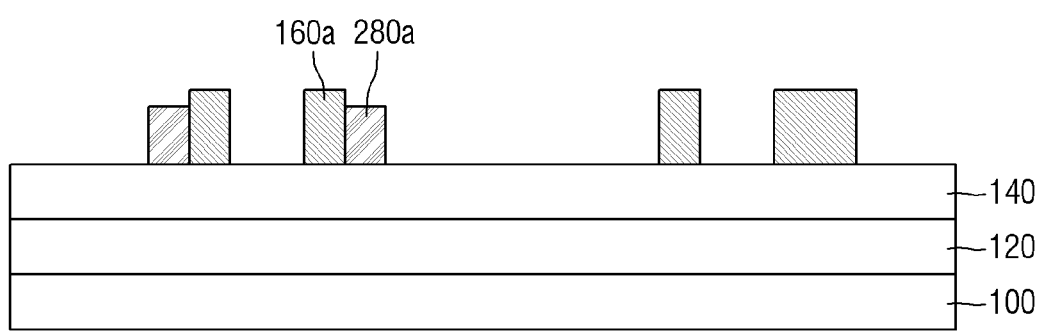

Referring to FIG. 17, the trim mask pattern 320, the second insulating layer 300, and the first insulating layer 240 may be removed to leave un-removed ones of the plurality of first slice walls 160a and the one or more second slice walls 280a. FIG. 17 corresponds to operation S100 of FIG. 3A.

Figure 18:
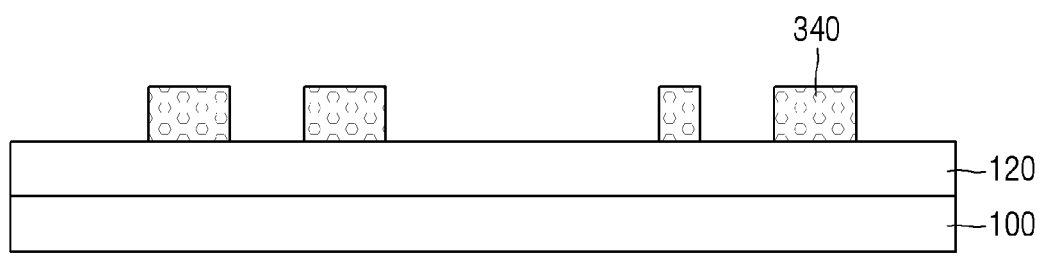

Referring to FIG. 18, the mask material layer may be etched to form a plurality of fin cut mask patterns 340 cut by using the remaining first slice walls 160a and the remaining one or more second slice walls 280a as a mask. FIG. 18 corresponds to operation S110 of FIG. 3B.

Figure 19:

Referring to FIG. 19, the fin 120 may be cut (e.g., etched) by using the plurality of fin cut mask patterns 340 as a mask to form a plurality of cut fin patterns 360. FIG. 19 corresponds to operation S120 of FIG. 3B.

According to some example embodiments of the inventive concepts, length of a fin that protrudes from a substrate may be defined by using the SADP process, a plurality of fill mask patterns blocking certain areas of the substrate, and the trim mask pattern opening one or more areas.

According to some example embodiments of the inventive concepts, a plurality of fins having various lengths may be defined by appropriately arranging mandrel structures for the SADP process such that some of the spacers merge with each other and the others of the spacers do not merge with each other.

According to some example embodiments of the inventive concepts, a length variation caused by an EUV photolithography may be prevented from being projected onto the resulting fins.

According to some example embodiments of the inventive concepts, the various fin cut mask patterns as illustrated in FIG. 2 may be implemented with relative ease.

According to some example embodiments of the inventive concepts, a plurality of fins may be defined to have a less length variation less than a plurality of fins defined by using the EUV photolithography.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims.

What is claimed is:

1. A method for defining a length of a fin that protrudes from a substrate, the method comprising:
   providing a mask material layer on the fin, the fin protruding from the substrate and horizontally extending in a first direction;
   forming a plurality of first slice walls on the mask material layer using a plurality of hard mask patterns, the plurality of first slice walls horizontally extending in a second direction, the second direction crossing the first direction;
   providing a first insulating layer on the plurality of first slice walls and the mask material layer;
   providing a plurality of fill mask patterns on the first insulating layer and to be self-aligned with respect to the plurality of first slice walls to expose one or more select areas between one or more pairs of adjacent ones of the plurality of first slice walls;
   removing the first insulating layer at the exposed one or more select areas, and the plurality of fill mask patterns;
   providing one or more second slice walls between one or more corresponding pairs of the plurality of first slice walls at the exposed one or more select areas, respectively;
   providing a second insulating layer on the first insulating layer, the plurality of first slice walls, and the one or more second slice walls;
   providing a trim mask pattern including one or more openings on the second insulating layer such that the trim mask pattern is self-aligned with respect to the one or more second slice walls to expose one or more of the plurality of first slice walls;
   removing the one or more of the plurality of first slice walls exposed by the trim mask pattern;
   removing the trim mask pattern and the first and second insulating layers;
   patterning the mask material layer using remaining ones of the plurality of first slice walls and the one or more second slice walls to form a plurality of fin cut mask patterns; and
   cutting the fin to have the length using the plurality of fin cut mask patterns.

2. The method of claim 1, wherein the forming the plurality of first slice walls includes:
   providing a first material layer on the mask material layer;
   providing the plurality of hard mask patterns on the first material layer; and
   patterning the first material layer using the plurality of hard mask patterns to form the plurality of first slice walls.

3. The method of claim 2, wherein the providing the plurality of hard mask patterns includes:
   providing a plurality of mandrel structures on the first material layer, the plurality of mandrel structures extending in the second direction;
   forming a plurality of spacers on sidewalls of the plurality of mandrel structures; and
   removing the plurality of mandrel structures to leave the plurality of spacers as the plurality of hard mask patterns.

4. The method of claim 3, wherein the forming the plurality of spacers includes forming one or more select pairs of the plurality of spacers to merge with each other.

5. The method of claim 3, wherein the plurality of spacers and the first material layer have an etch selectivity with each other.

6. The method of claim 3, wherein the providing the plurality of mandrel structures includes:
provding a mandrel material layer on the first material layer;
providing a mandrel mask pattern on the mandrel material layer;
patterning the mandrel material layer using the mandrel mask pattern; and
removing the mandrel mask pattern.

7. The method of claim 1, wherein the providing the plurality of fill mask patterns includes providing the plurality of fill mask patterns to be self-aligned with respect to the plurality of first slice walls such that a first side of the plurality of fill mask patterns that extends along the second direction are aligned to central positions of corresponding ones of the plurality of first slice walls, respectively.

8. The method of claim 1, wherein the providing the trim mask pattern includes providing the trim mask pattern to be self-aligned with respect to the one or more second slice walls such that a first side of the one or more openings that extend along the second direction are aligned to central positions of corresponding ones of the one or more second slice walls, respectively.

9. The method of claim 1, wherein the providing one or more second slice walls includes:
removing the first insulating layer at the one or more select areas exposed by the fill mask pattern and the fill mask pattern;
providing a second material layer on the first insulating layer to fill the one or more select areas; and
etch-back the second material layer to form the one or more second slice walls at the one or more select areas, respectively.

10. The method of claim 1, wherein the plurality of first slice walls and the one or more second slice walls have an etch selectivity with each other.

11. The method of claim 10, wherein the plurality of first slice walls includes nitride, and the one or more second slice walls includes oxide.

12. A method for patterning a line shape structure to have a length, the method comprising:
providing a plurality of line shape structures on a substrate, the plurality of line shape structures horizontally extending in a first direction;
providing a mask material layer on the plurality of line shape structures;
providing a first material layer on the mask material layer;
providing a plurality of first hard mask patterns on the first material layer;
patterning the first material layer using the plurality of first hard mask patterns to form a plurality of first slice walls, the plurality of first slice walls horizontally extending in a second direction, the second direction crossing the first direction;
providing a first insulating layer on the plurality of first slice walls and the mask material layer;
providing a plurality of fill mask patterns on the first insulating layer such that a first side of the plurality of fill mask patterns that extends along the second direction are aligned to central positions of corresponding ones of the plurality of first slice walls, respectively, to expose one or more select areas between one or more pairs of adjacent ones of the plurality of first slice walls;
removing the first insulating layer at the exposed one or more select areas and the plurality of fill mask patterns;
providing one or more second slice walls at the exposed one or more select areas;
providing a second insulating layer on the first insulating layer, the plurality of first slice walls, and the one or more second slice walls;
providing a trim mask pattern on the second insulating layer, the trim mask pattern including one or more openings on the second insulating layer such that a first side of the one or more openings that extend along the second direction are aligned to central positions of corresponding ones of the one or more second slice walls, respectively to expose one or more of the plurality of first slice walls;
removing the one or more of the plurality of first slice walls exposed by the trim mask pattern;
removing the trim mask pattern and the first and second insulating layers;
patterning the mask material layer using remaining ones of the plurality of first slice walls and the one or more second slice walls to form a plurality of second hard mask patterns; and
patterning the plurality of line shape structures using the plurality of second hard mask patterns.

13. The method of claim 12, wherein the providing the plurality of first hard mask patterns includes:
providing a plurality of mandrel structures on the first material layer, the plurality of mandrel structures extending in the second direction;
forming a plurality of spacers on sidewalls of the plurality of mandrel structures; and
removing the plurality of mandrel structures to leave the plurality of spacers as the plurality of first hard mask patterns.

14. The method of claim 13, wherein the providing the plurality of mandrel structures includes:
providing a mandrel layer on the first material layer;
providing a plurality of mandrel mask patterns on the mandrel layer; and
patterning the mandrel layer using the plurality of mandrel mask patterns to form the plurality of mandrel structures.

15. The method of claim 13, wherein the forming the plurality of spacers includes forming one or more select pairs of the plurality of spacers to merge with each other.

16. The method of claim 13, wherein the plurality of spacers and the first material layer have an etch selectivity with each other.

17. The method of claim 12, wherein the providing one or more second slice walls includes:
removing the first insulating layer at the one or more select areas exposed by the plurality of fill mask patterns;
providing a second material layer on the first insulating layer to fill the one or more select areas, from which the first insulating layer has been removed; and
etch-back the second material layer to form the one or more second slice walls at the one or more select areas.

18. The method of claim 12, wherein the plurality of first slice walls and the one or more second slice walls have an etch selectivity with respect to each other.

19. A method for defining a line pattern to have a length, the method comprising:
providing a plurality of line patterns on a substrate, the plurality of line patterns horizontally extending in a first direction;

providing a mask material layer on the substrate including the plurality of line patterns;

forming a plurality of first slice walls using a self-aligned double patterning (SADP), the plurality of first slice walls horizontally extending in a second direction different from the first direction;

providing a plurality of fill mask patterns over the plurality of first slice walls;

providing one or more second slice walls to fill spaces between corresponding pairs of adjacent ones of the plurality of first slice walls exposed by the plurality of fill mask patterns, a first side of the plurality of fill mask patterns extending along the second direction and aligned to central positions of corresponding ones of the plurality of first slice walls, respectively;

removing one or more of the plurality of first slice walls exposed by a trim mask pattern, the trim mask pattern including one or more openings such that a first side of the one or more openings extending along the second direction and aligned to central positions of corresponding ones of the one or more second slice walls, respectively;

patterning the mask material layer using remaining ones of the plurality of first slice walls and the one or more second slice walls as a plurality of hard mask patterns; and patterning the plurality of line patterns to have the length using the plurality of hard mask patterns.

20. The method of claim 19, wherein the forming the plurality of first slice walls using the self-aligned double patterning (SADP) includes:

providing a first material layer on the mask material layer;

providing a plurality of mandrel structures on the first material layer, the plurality of mandrel structures extending in the second direction;

forming a plurality of spacers on sidewalls of the plurality of mandrel structures;

removing the plurality of mandrel structures to leave the plurality of spacers as the plurality of hard mask patterns; and patterning the first material layer using the plurality of hard mask patterns to form the plurality of first slice walls.

\* \* \* \* \*